United States Patent
Lee et al.

(10) Patent No.: US 10,978,147 B2
(45) Date of Patent: Apr. 13, 2021

(54) READING METHOD OF RESISTIVE MEMORY DEVICE

(71) Applicant: SK hynix Inc., Icheon (KR)

(72) Inventors: Hyung Dong Lee, Suwon (KR); Tae Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/669,245

(22) Filed: Oct. 30, 2019

(65) Prior Publication Data

US 2020/0350009 A1    Nov. 5, 2020

(30) Foreign Application Priority Data

May 3, 2019 (KR) .................. 10-2019-0052466

(51) Int. Cl.
   *G11C 13/00* (2006.01)
   *G11C 11/16* (2006.01)

(52) U.S. Cl.
   CPC ........ *G11C 13/004* (2013.01); *G11C 13/0026* (2013.01); *G11C 13/0028* (2013.01); *G11C 11/1673* (2013.01); *G11C 13/0004* (2013.01)

(58) Field of Classification Search
   CPC ............ G11C 13/0026; G11C 13/0028; G11C 11/1673; G11C 13/0004
   See application file for complete search history.

(56) References Cited

U.S. PATENT DOCUMENTS

| | | | |
|---|---|---|---|
| 7,586,787 B2* | 9/2009 | Vo | G11C 7/12 365/185.18 |
| 9,627,055 B1* | 4/2017 | Robustelli | G11C 13/0033 |
| 9,984,748 B1* | 5/2018 | Lee | G11C 13/004 |
| 10,839,901 B1* | 11/2020 | Lee | G11C 11/1657 |
| 2008/0062741 A1* | 3/2008 | Choi | G11C 13/0004 365/148 |
| 2016/0217853 A1* | 7/2016 | Guliani | G11C 8/14 |
| 2016/0267974 A1* | 9/2016 | Miyazaki | G11C 13/0023 |
| 2016/0284399 A1* | 9/2016 | Mantegazza | G11C 13/0033 |
| 2019/0378567 A1* | 12/2019 | Gangasani | G11C 13/0033 |
| 2020/0027505 A1* | 1/2020 | Lee | G11C 11/1655 |
| 2020/0168273 A1* | 5/2020 | Kim | G11C 13/0004 |

FOREIGN PATENT DOCUMENTS

KR   101684104 B1   12/2016

* cited by examiner

*Primary Examiner* — Mushfique Siddique

(57) ABSTRACT

An electronic device includes a semiconductor memory. The semiconductor memory includes a bit line, a word line crossing the bit line, and a memory cell coupled to and disposed between the bit line and the word line. In a read operation, when the word line, which is in a precharged state, is floated, the bit line is driven to increase a voltage level of the bit line, and stopped when the memory cell is turned on.

17 Claims, 15 Drawing Sheets

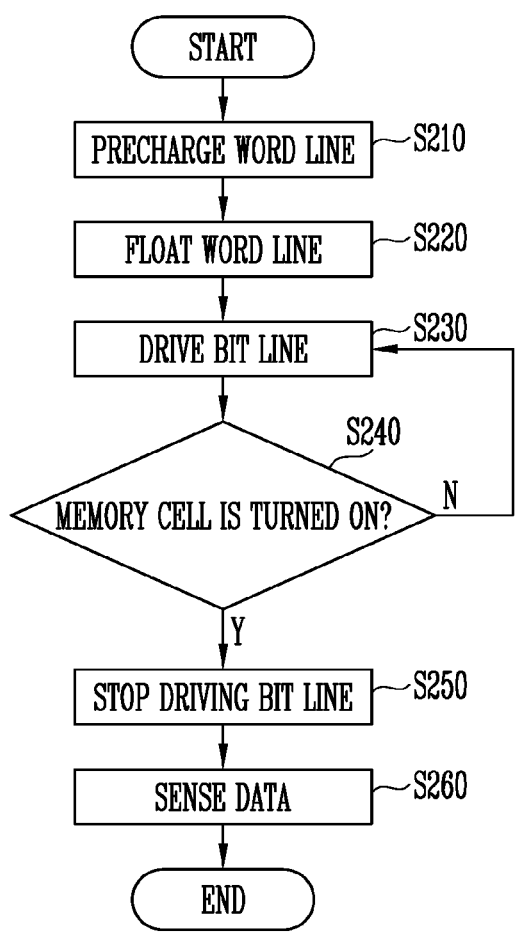

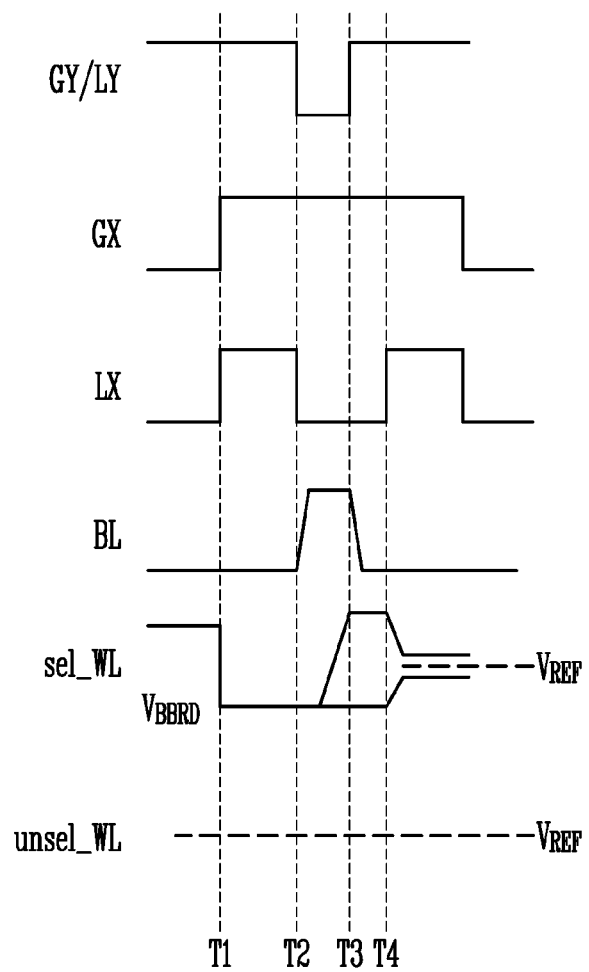

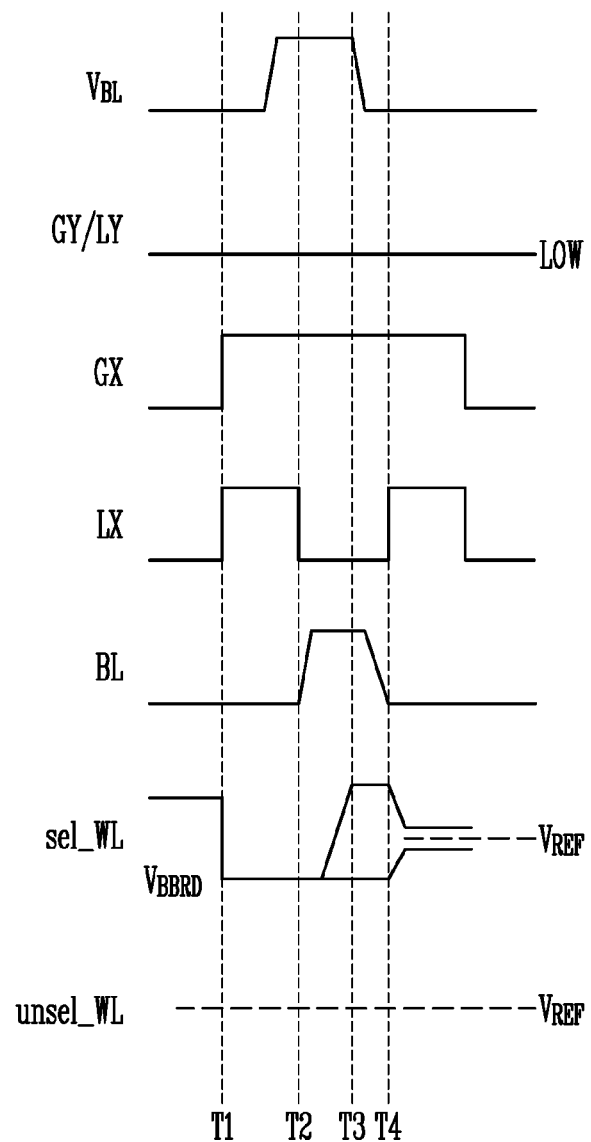

READING METHOD OF RESISTIVE MEMORY DEVICE

CROSS-REFERENCE TO RELATED APPLICATION

The present application claims priority under 35 U.S.C. § 119(a) to Korean Patent Application Number 10-2019-0052466, filed on May 3, 2019, which is incorporated herein by reference in its entirety.

BACKGROUND

Field of Invention

Various embodiments of the present disclosure generally relate to a memory circuit or device, and applications thereof in an electronic device.

Description of Related Art

Recently, with requirements of miniaturization, low power consumption, high performance, and diversification of electronic devices, semiconductor devices configured to store information are needed in various electronic devices such as computers and portable communication apparatuses. In addition, research on next-generation memory devices which can replace dynamic random access memories (DRAMs) and flash memories has been actively conducted.

One of the next-generation memory devices may be a resistive memory device using a variable resistance material capable of switching between at least two different resistance states due to a drastic change in resistance caused by a bias being applied to the variable resistance material. The resistive memory device may include any of a resistive random access memory (RRAM), a phase-change random access memory (PRAM), a magnetic random access memory (MRAM), a ferroelectric random access memory (FRAM), an E-fuse, and the like.

SUMMARY

Various embodiments of the present disclosure relate to an electronic device capable of stably reading data from a resistive memory device.

According to an embodiment, a method of operating an electronic device including memory cells, the method comprising: precharging a selected word line associated with a memory cell; floating the selected word line; driving a selected bit line to increase a voltage level of the selected bit line, the selected bit line being associated with the memory cell; and stopping the driving of the selected bit line when the memory cell is turned on.

According to an embodiment, a method of operating an electronic device including memory cells, the method comprising: precharging a selected local word line; floating the selected local word line; turning on a selected local switch to apply a read voltage to a selected memory cell through a selected local bit line, the selected memory cell being coupled to and disposed between the selected local word line and the selected local bit line, the selected local switch coupling the selected local bit line to a global bit line; and turning off the selected local switch when the selected memory cell is turned on by the read voltage.

According to an embodiment, an electronic device may include a semiconductor memory, the semiconductor memory comprising: a bit line; a word line crossing the bit line; and a memory cell coupled to and disposed between the bit line and the word line, wherein, in a read operation, when the word line, which is in a precharged state, is floated, the bit line is driven to increase a voltage level of the bit line and stopped when the memory cell is turned on.

BRIEF DESCRIPTION OF THE DRAWINGS

FIG. 3 is a flowchart illustrating a method of operating a memory device according to an embodiment of the present disclosure;

FIGS. 4A and 4B illustrate a method of operating a memory device according to an embodiment of the present disclosure;

FIGS. 7A and 7B illustrate a method of operating a memory device according to an embodiment of the present disclosure;

DETAILED DESCRIPTION

Hereinafter, various exemplary embodiments will be described in detail with reference to the accompanying drawings. In the following description, a detailed explanation of related functions and constitutions may be omitted for simplicity and conciseness. In addition, they may be embodied in different forms and should not be construed as limited to the embodiments set forth herein. Rather, these embodiments are provided so that this disclosure will be thorough and complete, and will fully convey the scope of the example embodiments to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Figure 1:
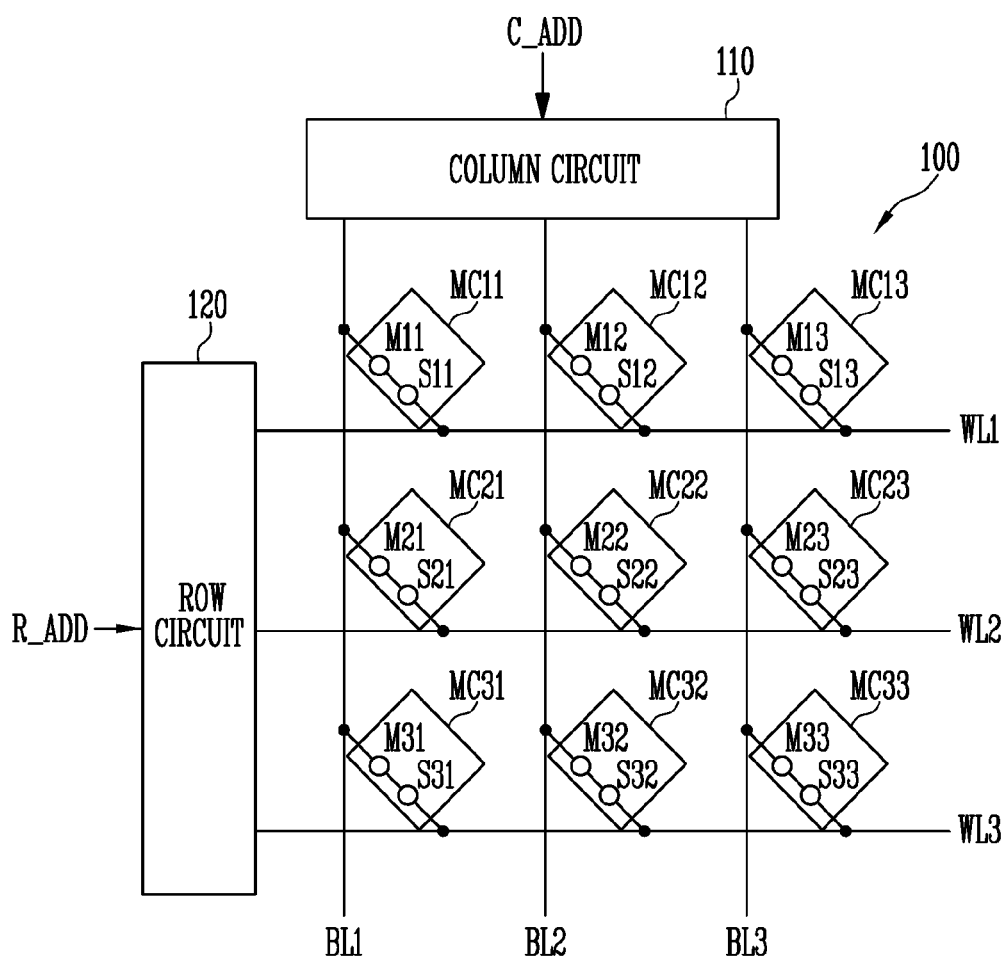
FIG. 1 illustrates a memory device according to an embodiment of the present disclosure.

FIG. 1 illustrates a memory device in accordance with an embodiment of the present disclosure. More specifically, FIG. 1 illustrates a memory cell array.

Referring to FIG. 1, the memory device may include a semiconductor memory, and the semiconductor memory may include a cell array 100. The cell array 100 may include row lines, column lines crossing the row lines, and a plurality of memory cells coupled to and disposed between the row lines and the column lines. The row lines may be word lines and the column lines may be bit lines. Alternatively, the row lines may be bit lines, and the column lines may be word lines. Hereinafter, it is assumed that the row lines are word lines and the column lines are bit lines.

Referring to FIG. 1, the cell array 100 may include word lines WL1 to WL3, bit lines BL1 to BL3, and memory cells MC11 to MC33 coupled to and disposed between the bit lines BL1 to BL3 and the word lines WL1 to WL3. The memory cells MC11 to MC33 may be located at intersections of the bit lines BL1 to BL3 and the word lines WL1 to WL3. The memory cells MC11 to MC33 may include selection elements S11 to S33 and memory elements M11 to M33. In each memory cell, a selection element and a memory element are coupled in series. Each of the selection elements S11 to S33 may be electrically coupled to a corresponding one of the word lines WL1 to WL3. Each of the memory elements M11 to M33 may be electrically coupled to a corresponding one of the bit lines BL1 to BL3.

Each of the memory elements M11 to M33 may include a variable resistance material and be configured to store data. Each of the memory elements M11 to M33 may include a resistance change layer, a phase change layer, a magnetic tunnel junction layer, or the like.

Each of the memory elements M11 to M33 may have a low resistance state or a high resistance state depending on data stored therein. For example, each of the memory elements M11 to M33 may have a low resistance value when it is in a crystalline state and a high resistance value when it is in an amorphous state. Hereinafter, the low resistance state is referred to as a 'SET' state and the high resistance state is referred to as a 'RESET' state.

Each of the selection elements S11 to S33 may include a switching material and be configured to select a corresponding one of the memory cell MC11 to MC33. Each of the selection elements S11 to S33 may be a metal insulator transition (MIT) device, a mixed ionic-electronic conducting (MIEC) device, an ovonic threshold switching (OTS) device, or the like. When the selection elements S11 to S33 include OTS devices, a very small amount of current may flow through the selection elements S11 to S33 when they are turned off. When an amount of current being applied to the memory cells MC11 to MC33 exceeds a threshold value Ith, the selection elements S11 to S33 may be turned on. When the selection elements S11 to S33 are turned on, an amount of current flowing through the memory cells MC11 to MC33 may be drastically increased, and thus a voltage at both ends of each of the memory cells MC11 to MC33 may be drastically decreased. That is, a snapback phenomenon may occur.

The structure of each of the memory cells MC11 to MC33 may vary. For example, the selection elements S11 to S33 may be omitted, or the positions of the selection elements S11 to S33 may be switched with the positions of the memory elements M11 to M33. That is, each of the selection elements S11 to S33 may be electrically coupled to a corresponding one of the bit lines BL1 to BL3, and each of the memory elements M11 to M33 may be electrically coupled to a corresponding one of the word lines WL1 to WL3.

The semiconductor memory may further include a column circuit 110 configured to control the bit lines BL1 to BL3, and a row circuit 120 configured to control the word lines WL1 to WL3. The row circuit 120 may be a row decoder, a word line decoder, a word line driver, or the like. The row circuit 120 may select the word line WL2, among the word lines WL1 to WL3, according to a row address R_ADD. The column circuit 110 may be a column decoder, a bit line decoder, a bit line driver, or the like. The column circuit 110 may select the bit line BL2, among the bit lines BL1 to BL3, according to a column address C_ADD. Accordingly, the memory cell MC22 coupled to and disposed between the selected bit line BL2 and the selected word line WL2 may be selected.

For convenience of explanation, FIG. 1 illustrates the cell array 100 that includes the three bit lines BL1 to BL3 and the three word lines WL1 to WL3. However, embodiments are not limited thereto. The number of bit lines or the number of word lines included in the cell array 100 may be changed as needed.

Figure 2:
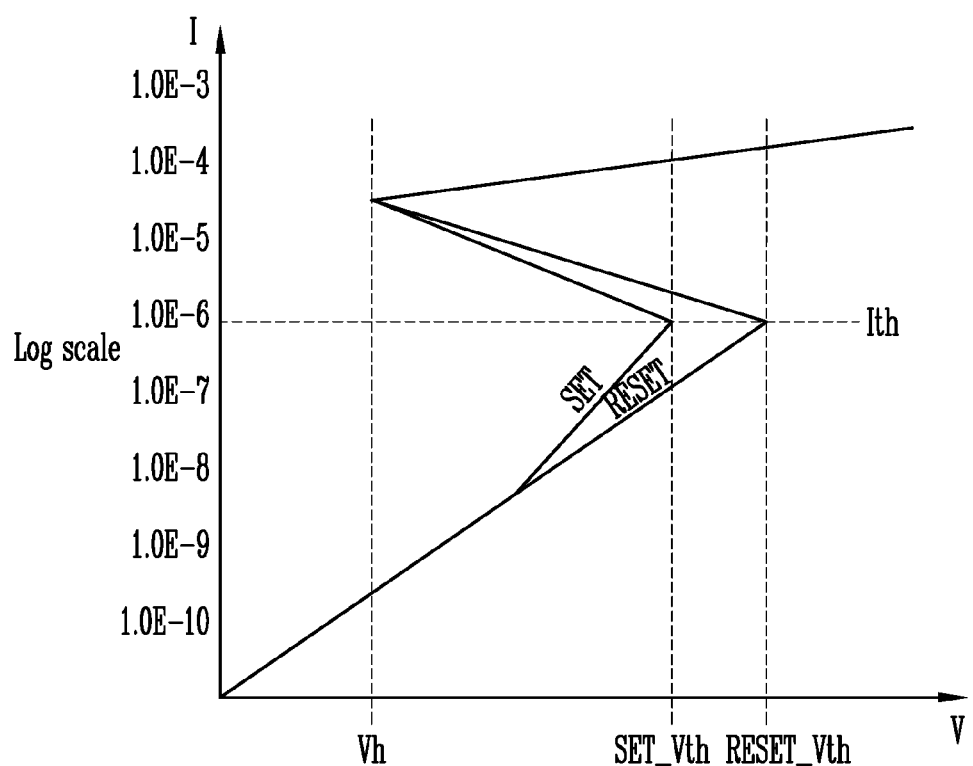
FIG. 2 is a graph illustrating an I-V curve of a memory cell according to an embodiment of the present disclosure.

FIG. 2 is a graph illustrating a current-voltage (I-V) curve of a memory cell according to an embodiment of the present disclosure. In FIG. 2, the X axis represents a voltage (V) applied to both ends of the memory cell and the Y axis represents a current (I) flowing through the memory cell.

Referring to FIG. 2, as a level of the voltage applied to both ends of the memory cell increases, an amount of current flowing through the memory cell may increase. However, since the memory cell has greater resistance when it is in a RESET state than when it is in a SET state, at the same voltage level, an amount of current flowing through the memory cell in the SET state may be greater than an amount of current flowing through the memory cell in the RESET state before the current flowing through the memory cell reaches a threshold value Ith.

When the voltage at both ends of the memory cell in the SET state reaches a threshold voltage SET_Vth, the amount of current flowing through the memory cell may reach the threshold value Ith, and thus a selection element of the memory cell may be turned on. As a result, a snapback phenomenon may occur, so that the voltage at both ends of the memory cell is decreased drastically and the amount of current flowing through the memory cell is increased drastically. When the voltage at both ends of the memory cell reaches a hold voltage Vh, the memory cell may be turned off again.

When a voltage at both ends of the memory cell in the RESET state reaches a threshold voltage RESET_Vth, the amount of current flowing through the memory cell may reach the threshold value Ith, and the selection element of the memory cell may be turned on. As a result, the snapback phenomenon may occur, so that the voltage at both ends of the memory cell is decreased drastically and the amount of current flowing through the memory cell is increased drastically. In addition, when the voltage at both ends of the memory cell reaches the hold voltage Vh, the memory cell may be turned off again.

As shown in FIG. 2, since the memory cell has greater resistance when it is in the RESET state than when it is in the SET state, the threshold voltage RESET_Vth is greater than the threshold voltage SET_Vth.

FIG. 3 is a flowchart illustrating a method of operating a memory device according to an embodiment of the present disclosure.

Referring to FIG. 3, a word line may be precharged at S210. For example, a selected word line, among a plurality of word lines in the memory device, may be precharged to a voltage $V_{BBRD}$. The voltage $V_{BBRD}$ may have a negative level.

The precharged word line may be floated at S220, and a selected bit line, among a plurality of bit lines in the memory device, may be driven at S230. By driving the selected bit line, a voltage level of the selected bit line may be increased. As a result, a read voltage may be applied to both ends of a selected memory cell MC coupled to the selected word line and the selected bit line. In addition, the read voltage may increase as the voltage level of the selected bit line increases. The read voltage may be determined by a difference between the voltage level of the selected bit line and the voltage level of the selected word line.

The selected bit line may be driven until the selected memory cell MC is turned on. When it is determined that the selected memory cell MC is turned on at S240, the driving of the selected bit line may be stopped at S250.

If the selected memory cell MC is in a RESET state, the selected memory cell MC may not be turned on when the read voltage is less than the threshold voltage RESET_Vth of the selected memory cell MC. Therefore, when it is determined that the selected memory cell MC is not turned on at S240, the selected bit line is still driven at S230, and the selected word line may maintain the precharged voltage level.

If the selected memory cell MC is in a SET state, when the read voltage becomes greater than the threshold voltage SET_Vth of the selected memory cell MC in the SET state, the selected memory cell MC may be turned on and a snapback phenomenon may occur. Due to the snapback phenomenon, a current may flow through the selected memory cell MC and a voltage level of the selected word line may increase. After that, when the read voltage applied to the selected memory cell MC is reduced and thus reach the hold voltage Vh, the selected memory cell MC may be turned off.

However, the selected bit line continues to be driven even after the selected memory cell MC is switched to the turn-off state, and thus the voltage level of the selected bit line may keep increasing or may be maintained at a high level. As a result, the selected memory cell MC may be turned on again, which may cause read disturbance. Therefore, embodiments of the present disclosure provide concepts of stopping the driving of the selected bit line when the selected memory cell MC is turned on. As a result, the selected memory cell MC may be prevented from being turned on again after the selected memory cell MC is turned on and then turned off.

Whether the selected memory cell MC is turned on or off may be directly sensed or estimated. In an embodiment, an amount of time until the selected memory cell MC in the SET state is turned on from a time when the selected word line is floated may be predicted, and the predicted amount of time may be set as a predetermined time. The driving of the selected bit line may be stopped after the predetermined time from the time when the selected word line is floated.

In another embodiment, a voltage level of the selected word line may be sensed and the driving of the selected bit line may be stopped when the voltage level of the word line rapidly increases.

According to some embodiments, by turning off a switch coupled to and disposed between the selected bit line and the selected memory cell MC or by lowering the voltage level of the selected bit line, the driving of the selected bit line may be stopped.

After the driving of the selected bit line is stopped at S250, data stored in the selected memory cell MC may be read at S260. For example, since the selected word line is coupled to a sensing circuit, the sensing circuit senses the voltage level of the selected word line to thereby read the data stored in the selected memory cell MC. The sensing circuit may be a sense amplifier.

According to the above-described operating method, when the selected memory cell MC in the SET state is turned on, the driving of the selected bit line may be stopped. Therefore, during a read operation, deterioration, e.g., the read disturbance, which may be caused when the selected memory cell MC in the SET state is repetitively turned on and off, may be prevented.

Figure 4A:
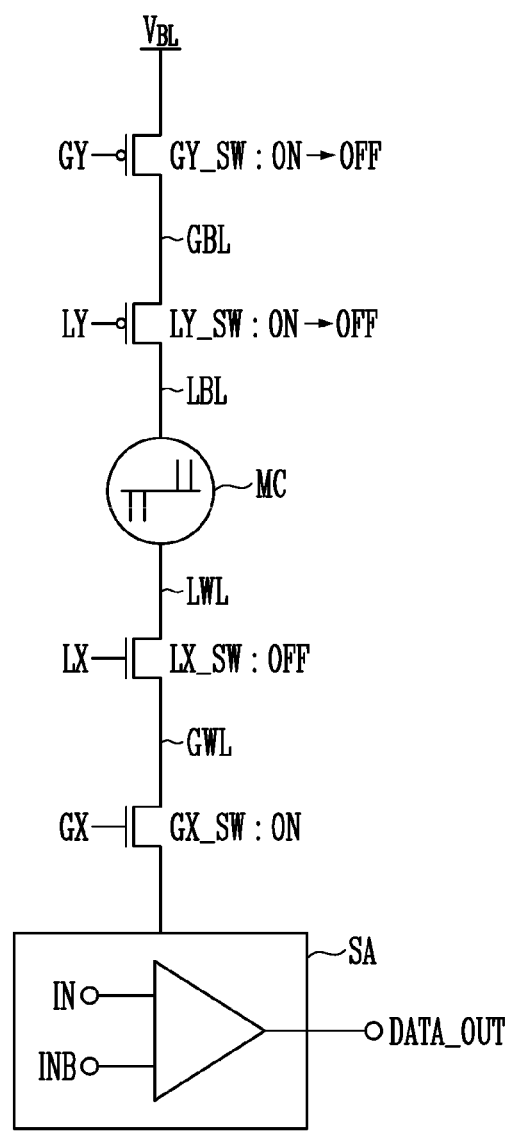

FIGS. 4A and 4B illustrate a method of operating a memory device according to an embodiment of the present disclosure. FIG. 4A illustrates a current path in a read operation and FIG. 4B is a timing diagram illustrating the read operation. Hereinafter, any repetitive detailed description of components already mentioned above will be omitted.

Referring to FIG. 4A, the memory device may include a global bit line GBL, a local bit line LBL, a memory cell MC, a local word line LWL, and a global word line GWL. The memory cell MC may be coupled to and disposed between the local bit line LBL and the local word line LWL.

One global bit line GBL may be coupled to a plurality of local bit lines LBL. A plurality of local bit line switches LY_SW may be coupled to and disposed between the global bit line GBL and the plurality of local bit lines LBL, respectively. Therefore, the connections between the plurality of local bit lines LBL and the global bit line GBL may be controlled by controlling the plurality of local bit line switches LY_SW. A global bit line switch GY_SW may be coupled to the global bit line GBL. Applying a bit line voltage $V_{BL}$ to the global bit line GBL may be controlled by controlling the global bit line switch GY_SW.

One global word line GWL may be coupled to a plurality of local word lines LWL. A plurality of local word line switches LX_SW may be coupled to and disposed between the global word line GWL and the plurality of local word lines LWL, respectively. Therefore, the connections between the plurality of local word lines LWL and the global word line GWL may be controlled by controlling the plurality of local word line switches LX_SW. A global word line switch GX_SW may be coupled to and disposed between the global word line GWL and a sense amplifier SA.

In the embodiment illustrated in FIG. 4A, the global word line switch GX_SW and the local word line switch LX_SW may be implemented with NMOS transistors, and the global bit line switch GY_SW and the local bit line switches LY_SW may be implemented with PMOS transistors. However, embodiments are not limited thereto. In another embodiment, the global word line switch GX_SW and the local word line switch LX_SW may be implemented with PMOS transistors, and the global bit line switch GY_SW and the local bit line switches LY_SW may be implemented with NMOS transistors.

Referring to FIGS. 4A and 4B, at a first time T1, a selected word line sel_WL, among a plurality of word lines in the memory device, may be precharged to, e.g., a voltage $V_{BBRD}$. In particular, by activating a local word line signal LX and a global word line signal GX to a high level, the local word line switch LX_SW and the global word line switch GX_SW may be turned on. At this time, the global bit line switch GY_SW and the local bit line switch LY_SW may be turned off by deactivating a global bit line signal GY and a local bit line signal LY to a high level. As a result, the selected word line sel_WL may be precharged to the voltage $V_{BBRD}$. A reference voltage $V_{REF}$ may be applied to an unselected word line unset WL.

At a second time T2 following the first time T1, the selected word line sel_WL may be floated since the local word line LWL is floated by deactivating the local word line signal LX to a low level to turn off the local word line switch LX_SW.

At the second time T2, a selected bit line BL may be driven. In particular, the global bit line switch GY_SW and the local bit line switch LY_SW may be turned on by activating the global bit line signal GY and the local bit line signal LY to a low level. In this manner, the bit line voltage $V_{BL}$ may be applied to the selected bit line BL, and thus voltage levels of the global bit line GBL and the local bit line LBL may increase.

When the selected memory cell MC is in the SET state, the selected memory cell MC may be turned on as a voltage level of the selected bit line BL exceeds a predetermined level. Accordingly, the voltage level of the selected word line sel_WL may increase, and the selected memory cell MC may be turned off. When the selected memory cell MC is in the RESET state, the selected memory cell MC may remain turned off even though the voltage level of the selected bit line BL exceeds the predetermined level, and thus the voltage level of the selected word line sel_WL may remain at the voltage $V_{BBRD}$.

The selected bit line BL of FIG. 4B may correspond to the local bit line LBL of FIG. 4A, and the selected word line sel_WL of FIG. 4B may correspond to the local word line LWL of FIG. 4A.

At a third time T3 following the second time T2, the driving of the selected bit line BL may be stopped by deactivating the global bit line signal GY and the local bit line signal LY to a high level so that the global bit line switch GY_SW and the local bit line switch LY_SW may be turned off (ON→OFF). In this manner, a further increase in the voltage level of the selected bit line BL may be prevented and the selected memory cell MC in the SET state may be prevented from being turned on again after the selected memory cell MC is turned on and then turned off. At this time, the local word line switch LX_SW may remain turned off (OFF) and the global word line switch GX_SW may remain turned on (ON).

FIG. 4A shows turn-on/off states of the local word line switch LX_SW, the global word line switch GX_SW, the local bit line switch LY_SW, and the global bit line switch GY_SW when the driving of the selected bit line BL is stopped at the third time T3.

At a fourth time T4 following the third time T3, data stored in the selected memory cell MC may be read by the sense amplifier SA. In particular, at the fourth time T4, the local word line switch LX_SW may be turned on by activating the local word line signal LX to a high level. As a result, the selected word line sel_WL may be coupled to the sense amplifier SA in which input terminals IN and INB of the sense amplifier SA may be precharged to the reference voltage $V_{REF}$. When the local word line switch LX_SW and the global word line switch GX_SW are turned on, the selected word line sel_WL may be coupled to the input terminal IN to enable charge sharing between the selected word line sel_WL and the input terminal IN. At this time, the input terminal INB may maintain the reference voltage $V_{REF}$. Therefore, the data of the selected memory cell MC may be sensed and amplified by the sense amplifier SA, and then output (DATA_OUT) through an output terminal of the sense amplifier SA. According to the above-described method, when the selected memory cell MC in the SET state is turned on, the driving of the selected bit line BL may be stopped. In other words, the global bit line switch GY_SW and the local bit line switch LY_SW may be turned off before the fourth time T4 when the local word line switch LX_SW is turned on. Therefore, during the read operation, the selected memory cell MC in the SET state may be prevented from being repetitively turned on and off by the increased voltage level of the selected bit line BL.

In an embodiment, the third time T3 when the driving of the selected bit line BL is stopped may be set at a given time (e.g., predetermined time) after the second time T2 (i.e., after the selected word line sel_WL is floated) by turning off the local word line switch LX_SW. The length of the given time corresponds to an amount of time elapsed from the time the selected memory cell MC in the SET state is turned on after the selected word line is floated at the second time T2.

In another embodiment, the third time T3 may be set by sensing the voltage level of the selected word line sel_WL and detecting the rising of the voltage level of the selected word line sel_WL. For example, the third time T3 is set when the voltage level of the selected word line sel_WL exceeds a preset level that is higher than a level of the voltage $V_{BBRD}$. The rising of the voltage level of the selected word line sel_WL occurs as a result of the selected memory cell MC being turned on.

Figure 5A:
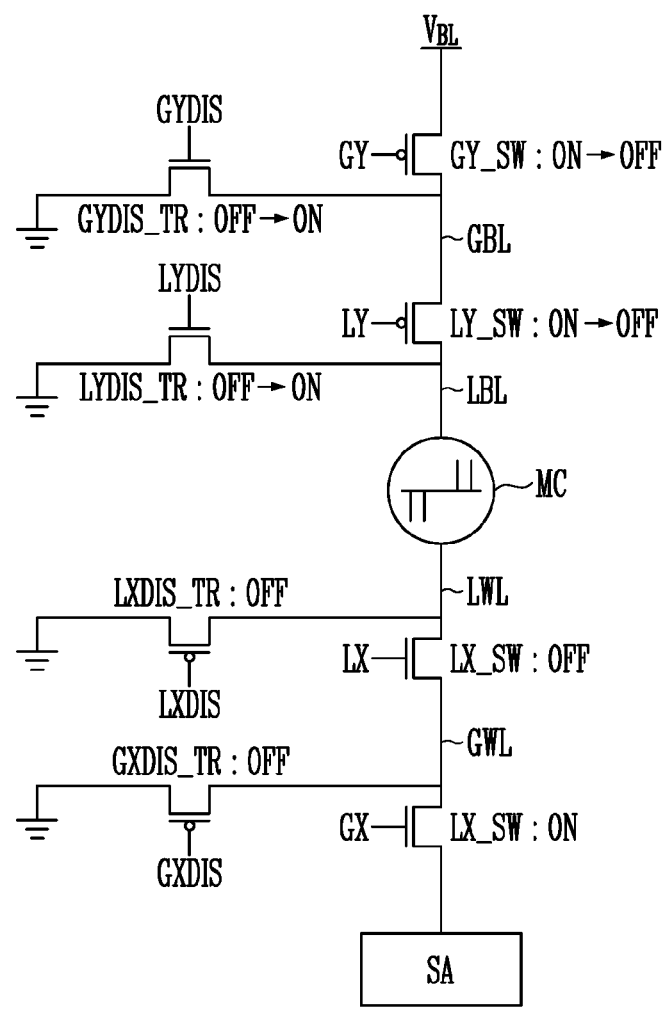
FIGS. 5A and 5B illustrate a method of operating a memory device according to an embodiment of the present disclosure.
Figure 5B:
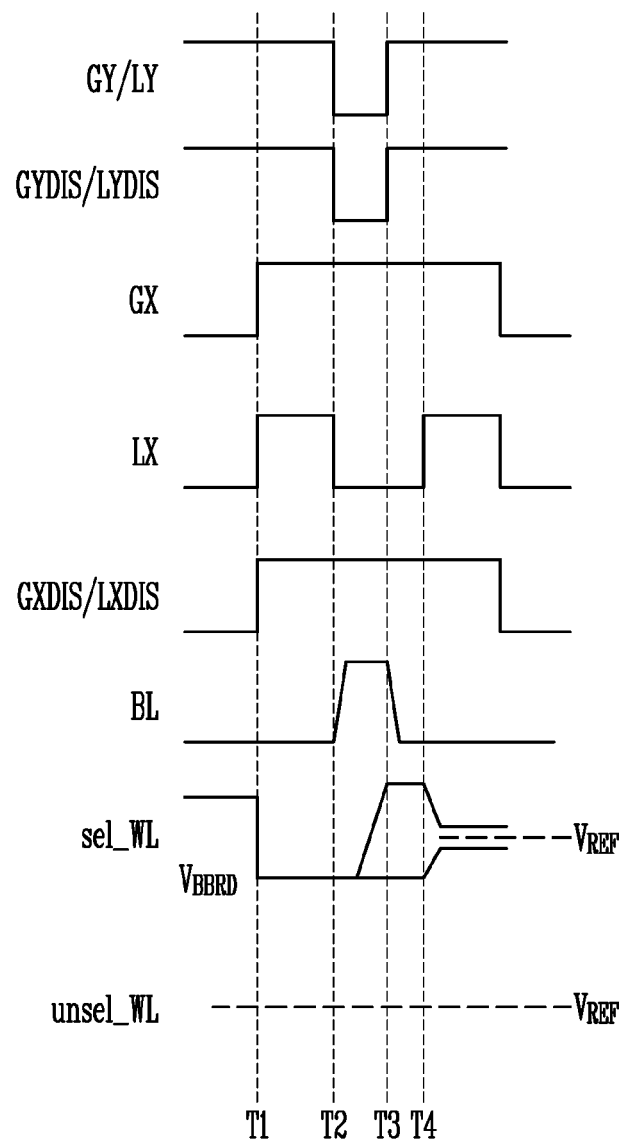

FIGS. 5A and 5B illustrate a method of operating a memory device according to an embodiment of the present disclosure. FIG. 5A illustrates a current path in a read operation and FIG. 5B is a timing diagram illustrating the read operation. Hereinafter, any repetitive detailed description of components already mentioned above will be omitted.

Referring to FIG. 5A, the memory device may further include a GY discharge transistor GYDIS_TR coupled to a global bit line GBL, an LY discharge transistor LYDIS_TR coupled to a local bit line LBL, a GX discharge transistor GXDIS_TR coupled to a global word line GWL, and an LX discharge transistor LXDIS_TR coupled to a local word line LWL compared to the memory device illustrated in FIG. 4A. The GY discharge transistor GYDIS_TR may operate in an opposite way to the global bit line switch GY_SW, and the LY discharge transistor LYDIS_TR may operate in an opposite way to the local bit line switch LY_SW. The GX discharge transistor GXDIS_TR and the LX discharge transistor LXDIS_TR may operate in an opposite way to the global word line switch GX_SW.

In the embodiment illustrated in FIG. 5A, the GY discharge transistor GYDIS_TR and the LY discharge transistor LYDIS_TR may be NMOS transistors, and the GX discharge transistor GXDIS_TR and the LX discharge transistor LXDIS_TR may be PMOS transistors. However, embodiments are not limited thereto.

Referring to FIGS. 5A and 5B, at a first time T1, the selected word line sel_WL, among the plurality of word lines in the memory device, may be precharged to the voltage $V_{BBRD}$. By activating the local word line signal LX and the global word line signal GX to a high level, the local word line switch LX_SW and the global word line switch GX_SW may be turned on. At this time, the LX discharge transistor LXDIS_TR and the GX discharge transistor GXDIS_TR may be turned off by deactivating an LX discharge signal LXDIS and a GX discharge signal GXDIS to a high level.

At the first time T1, the global bit line switch GY_SW and the local bit line switch LY_SW may be turned off. On the other hand, a GY discharge signal GYDIS and an LY discharge signal LYDIS may be activated to a high level, and thus the GY discharge transistor GYDIS_TR and the LY discharge transistor LYDIS_TR may be turned on.

At a second time T2 following the first time T1, the selected word line sel_WL may be floated. The local word line switch LX_SW may be turned off by deactivating the local word line signal LX to a low level. As a result, the local word line LWL may be floated. Each of the LX discharge signal LXDIS and/or the GX discharge signal GXDIS may be maintained at a high level, such that the LX discharge transistor LXDIS_TR and/or the GX discharge transistor GXDIS_TR may remain turned off.

At the second time T2, the selected bit line BL may be driven by activating the global bit line signal GY and the local bit line signal LY to a low level so that the global bit line switch GY_SW and the local bit line switch LY_SW are turned on. As a result, a voltage level of each of the global bit line GBL and the local bit line LBL may increase by the bit line voltage $V_{BL}$. At this time, the GY discharge transistor GYDIS_TR and the LY discharge transistor LYDIS_TR may be turned off by deactivating the GY discharge signal GYDIS and the LY discharge signal LYDIS to a low level.

Between the second time T2 and a third time T3 following the second time T2, a voltage level of the selected word line sel_WL may increase or be maintained at the voltage $V_{BBRD}$ depending on a value of data stored in the selected memory cell MC.

At the third time T3, by deactivating the global bit line signal GY and the local bit line signal LY to a high level, the global bit line switch GY_SW and the local bit line switch LY_SW may be turned off (ON→OFF). As a result, a further increase in the voltage level of the selected bit line BL may be prevented. In other words, by stopping the driving of the selected bit line BL, the selected memory cell MC in the SET state may be prevented from being turned on again. At this time, the GY discharge transistor GYDIS_TR and the LY discharge transistor LYDIS_TR may be turned on by activating the GY discharge signal GYDIS and the LY discharge signal LYDIS to a high level. As a result, the voltage level of the selected bit line BL may be lowered since the selected bit line BL is coupled to a ground voltage terminal through the LY discharge transistor LYDIS_TR that is turned on.

FIG. 5A shows turn-on/off states of the local word line switch LX_SW, the global word line switch GX_SW, the local bit line switch LY_SW, the global bit line switch GY_SW, the LX discharge transistor LXDIS_TR, the GX discharge transistor GXDIS_TR, the LY discharge transistor LYDIS_TR, and the GY discharge transistor GYDIS_TR when the driving of the selected bit line BL is stopped at the third time T3.

At a fourth time T4 following the third time T3, data stored in the selected memory cell MC may be read by the sense amplifier SA. In particular, the local word line switch LX_SW may be turned on by activating the local word line signal LX to a high level. As a result, the selected word line sel_WL may be coupled to the sense amplifier SA, and the data of the selected memory cell MC may be sensed and amplified by the sense amplifier SA and then output (DATA_OUT) through an output terminal of the sense amplifier SA. At this time, the LX discharge signal LXDIS and the GX discharge signal GXDIS may remain at a high level, such that the LX discharge transistor LXDIS_TR and the GX discharge transistor GXDIS_TR may remain turned off.

According to the above-described method, when the global bit line switch GY_SW and the local bit line switch LY_SW are turned off at the third time T3, the GY discharge transistor GYDIS_TR and the LY discharge transistor LYDIS_TR may be turned on. Therefore, the driving of the selected bit line BL may be quickly stopped, and the voltage level of the selected bit line BL may be lowered.

In this embodiment shown in FIGS. 5A and 5B, the third time T3 at which the driving of the selected bit line BL is stopped may be determined as described above with reference to FIGS. 4A and 4B.

Figure 6A:
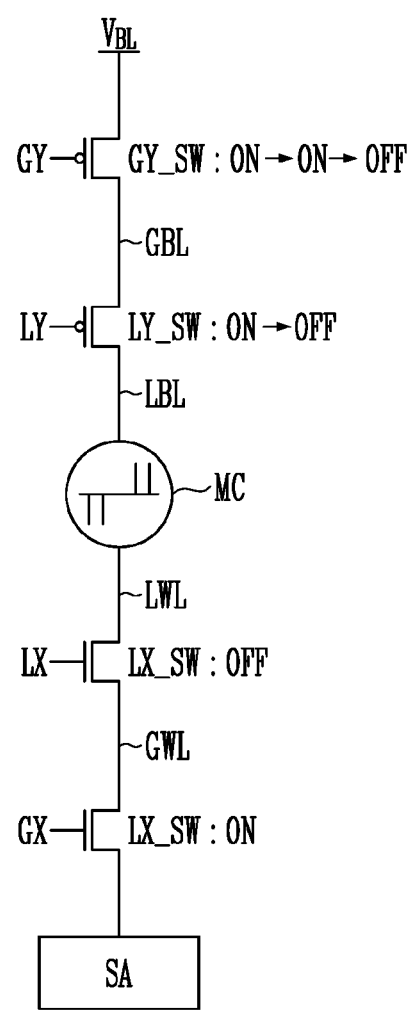
FIGS. 6A and 6B illustrate a method of operating a memory device according to an embodiment of the present disclosure.
Figure 6B:
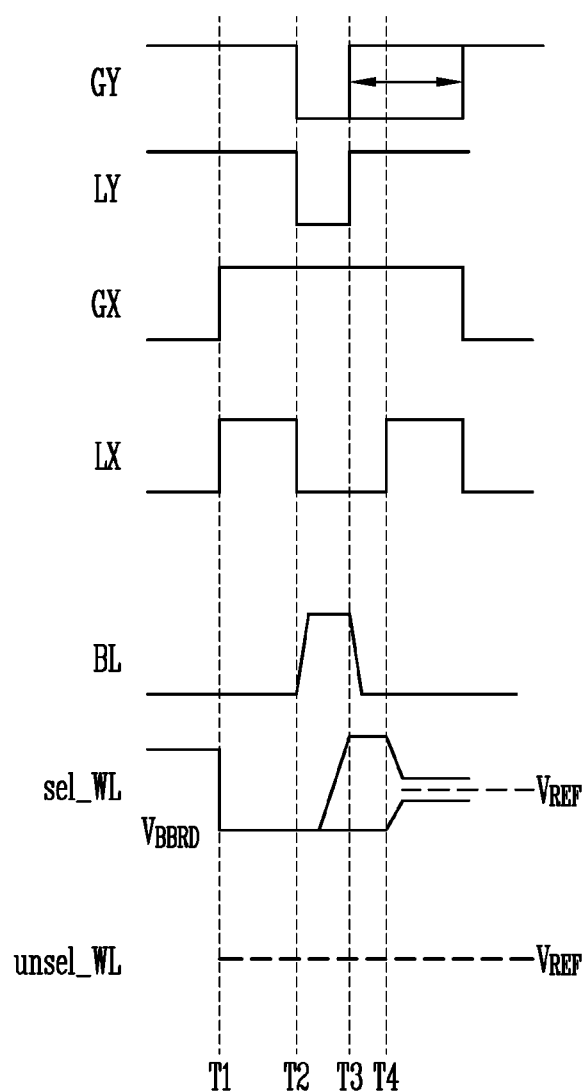

FIGS. 6A and 6B illustrate a method of operating a memory device according to an embodiment of the present disclosure. FIG. 6A illustrates a current path in a read operation. FIG. 6B is a timing diagram illustrating the read operation. Hereinafter, any repetitive detailed description of components already mentioned above will be omitted.

The memory device illustrated in FIG. 6A has the same configuration as the memory device illustrated in FIG. 4A.

Referring to FIGS. 6A and 6B, at a first time T1, the selected word line sel_WL, among the plurality of word lines in the memory device, may be precharged to the voltage $V_{BBRD}$. At a second time T2 following the first time T1, the selected word line sel_WL may be floated and the selected bit line BL may be driven. Between the second time T2 and a third time T3 following the second time T2, a voltage level of the selected word line sel_WL may increase or be maintained at the voltage $V_{BBRD}$ depending on a value of data stored in a selected memory cell MC.

At the third time T3, the driving of the selected bit line BL may be stopped. At this time, the global bit line switch GY_SW and the local bit line switch LY_SW may be turned off at different times. For example, after the local bit line switch LY_SW is turned off at the third time T3, the global bit line switch GY_SW may be turned off at a different time from the third time T3. First, by deactivating the local bit line signal LY to a high level, the local bit line switch LY_SW may be turned off (ON→OFF). Subsequently, by deactivating the global bit line signal GY to a high level, the global bit line switch GY_SW may be turned off (ON→ON→OFF). Therefore, the global bit line switch GY_SW may remain turned on for a predetermined period of time after the local bit line switch LY_SW is turned off. Therefore, the global bit line switch GY_SW may be turned off at a certain time between the third time T3 and a fourth time T4 following the third time T3, or after the fourth time T4.

At the fourth time T4, by turning on the local word line switch LX_SW, the data stored in the selected memory cell MC may be read by the sense amplifier SA.

According to the above-described method, by turning off the global bit line switch GY_SW and the local bit line switch LY_SW at different times, the driving of the selected bit line BL may be quickly stopped. By turning off the local bit line switch LY_SW before the global bit line switch GY_SW is turned off, the increasing of the voltage level of the selected bit line BL may be quickly stopped.

In this embodiment shown in FIGS. 6A and 6B, the third time T3 at which the driving of the selected bit line BL is stopped may be determined as described above with reference to FIGS. 4A and 4B.

Figure 7A:
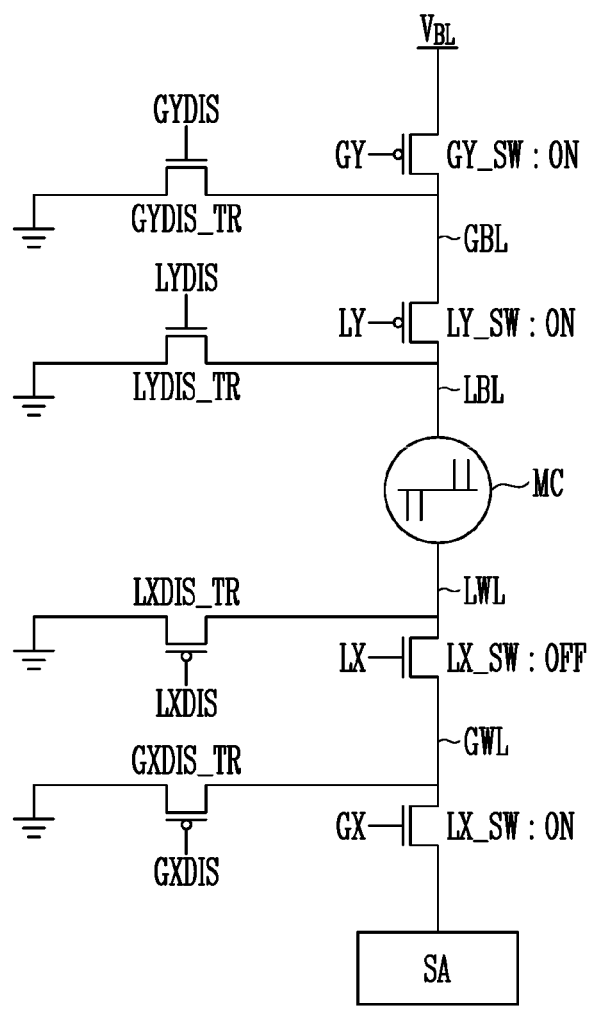

FIGS. 7A and 7B illustrate a method of operating a memory device according to an embodiment of the present disclosure. FIG. 7A illustrates a current path in a read operation. FIG. 7B is a timing diagram illustrating the read operation. Hereinafter, any repetitive detailed description of components already mentioned above will be omitted.

The memory device illustrated in FIG. 7A has the same configuration as the memory device illustrated in FIG. 5A.

Referring to FIGS. 7A and 7B, at a first time T1, the selected word line sel_WL, among the plurality of word lines in the memory device, may be precharged to the voltage $V_{BBRD}$.

The selected bit line BL may be driven between the first time T1 and a second time T2 following the first time T1.

The global bit line signal GY may have an activated state, i.e., a low level, and thus the global bit line switch GY_SW may be in a turn-on state. Therefore, the bit line voltage $V_{BL}$ may be transferred to the global bit line GBL, such that the voltage level of the global bit line GBL may increase. In addition, the local bit line signal LY may have an activated state, i.e., a low level, and thus the local bit line switch LY_SW may be in a turn-on state. Therefore, as the voltage level of the global bit line GBL increases, the voltage level of the local bit line LBL may also increase. A delay may occur between a time when the voltage level of the bit line voltage $V_{BL}$ increases and a time when the voltage level of the selected bit line BL increases.

At the second time T2, the selected word line sel_WL may be floated since the local word line switch LX_SW is turned off by deactivating the local word line signal LX to a low level. Between the second time T2 and a third time T3 following the second time T2, the voltage level of the selected word line sel_WL may increase or be maintained at the voltage $V_{BBRD}$ depending on a value of data stored in the selected memory cell MC.

At the third time T3, the driving of the selected bit line BL may be stopped. For example, by reducing the voltage level of the bit line voltage $V_{BL}$ that is supplied to the selected bit line, the voltage level of the global bit line GBL may be reduced. In another example, by activating the GY discharge signal GYDIS to a high level to turn on the GY discharge transistor GYDIS_TR, the voltage level of the global bit line GBL may be reduced. Since each of the global bit line switch GY_SW and the local bit line switch LY_SW is in a turn-on state, the voltage level of the local bit line LBL may also decrease as the voltage level of the global bit line GBL is reduced. A delay may occur between a time when the voltage level of the bit line voltage $V_{BL}$ decreases and a time when the voltage level of the selected bit line BL decreases.

At a fourth time T4 following the third time T3, by turning on the local word line switch LX_SW, the data stored in the selected memory cell MC may be read by the sense amplifier SA.

According to the above-described method, the driving of the selected bit line BL may be stopped by decreasing the level of the bit line voltage $V_{BL}$. Therefore, during a read operation, deterioration, e.g., the read disturbance, which may be caused when the selected memory cell MC in the SET state is repetitively turned on and off, may be prevented.

In this embodiment shown in FIGS. 7A and 7B, the third time T3 at which the driving of the selected bit line BL is stopped may be determined as described above with reference to FIGS. 4A and 4B.

A memory circuit or a semiconductor device in which any one of the above-described embodiments is implemented may be used in various electronic devices or systems. FIGS. 8 to 12 show some examples of a device or a system embodying a memory circuit or a semiconductor device according to the above-described embodiments.

Figure 8:
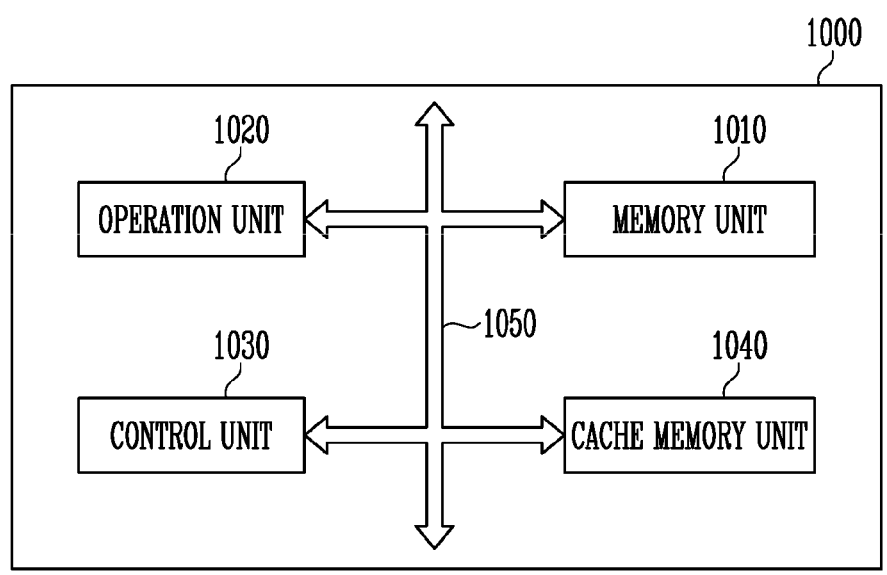
FIG. 8 illustrates a microprocessor employing a memory device according to an embodiment of the present disclosure.

FIG. 8 illustrates a microprocessor 1000 employing a memory device according to an embodiment of the present disclosure.

Referring to FIG. 8, the microprocessor 1000 may control and adjust a series of processes of receiving data from various external devices, processing the data, and sending processing results to the external devices. The microprocessor 1000 may include a memory unit 1010, an operation unit 1020, and a control unit 1030. The microprocessor 1000 may be any of various data processing units such as a central processing unit (CPU), a graphic processing unit (GPU), a digital signal processor (DSP), an application processor (AP), and the like.

The memory unit 1010 may be a processor register or a register, and may store data in the microprocessor 1000. The memory unit 1010 may include any of various registers such as a data register, an address register, a floating point register, and the like. The memory unit 1010 may serve to temporarily store an address at which data for performing an operation is stored, data corresponding to a result of performing the operation, and data for performing the operation.

The memory unit 1010 may employ at least one of the embodiments described above with reference to FIGS. 4A to 7B. For example, the memory unit 1010 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Accordingly, read operation characteristics of the memory unit 101 may be improved. As a result, read operation characteristics of the microprocessor 1000 may be also improved.

The operation unit 1020 may perform one of fundamental arithmetic operations or logical operations according to a result of decoding a command. The operation unit 1020 may include at least one arithmetic and logic unit (ALU).

The control unit 1030 may receive signals from the memory unit 1010, the operation unit 1020, and the external devices of the microprocessor 1000, extract or decode a command, control the signal input and output of the microprocessor 1000, and execute processing represented by a program.

According to an embodiment of the present disclosure, the microprocessor 1000 may further include a cache memory unit 1040 that temporarily stores data input from an external device or data to be output to the external device, in addition to the memory unit 1010. The cache memory unit 1040 may exchange data with the memory unit 1010, the operation unit 1020, and the control unit 1030 through a bus interface 1050.

Figure 9:
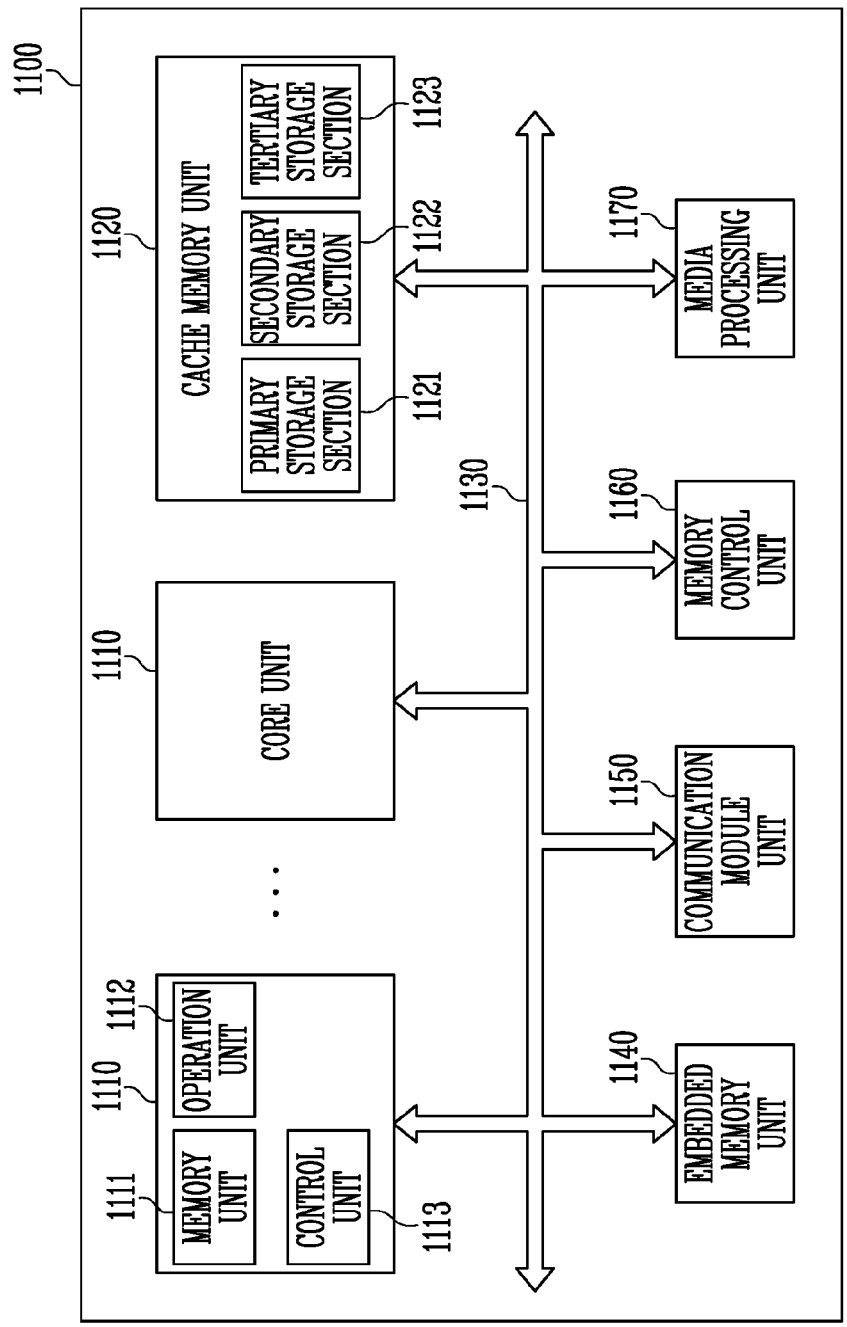
FIG. 9 illustrates a processor employing a memory device according to an embodiment of the present disclosure.

FIG. 9 illustrates a processor 1100 employing a memory device according to an embodiment of the present disclosure.

Referring to FIG. 9, the processor 1100 may improve performance and perform multiple functions in addition to the functions of the microprocessor described above with reference to FIG. 8. The processor 1100 may include a core unit 1110 serving as a microprocessor, a cache memory unit 1120 temporarily storing data, and a bus interface 1130 for data transfer between internal and external devices. The processor 1100 may include any of a multi-core processor, a graphic processing unit (GPU), an application processor (AP), and so on.

According to an embodiment of the present disclosure, the core unit 1110 may perform arithmetic and logic operations on data input from an external device, and may include a memory unit 1111, an operation unit 1112, and a control unit 1113.

The memory unit 1111 may be a processor register or a register, and may store data in the processor 1100. The memory unit 1111 may include any of various registers including a data register, an address register, a floating point register, and the like. The memory unit 1111 may serve to temporarily store an address at which data for performing an operation is stored, data corresponding to a result of performing the operation, and data for performing the operation.

The operation unit 1112 may perform an operation in the processor 1100. More specifically, the operation unit 1112 may perform four fundamental arithmetic operations and/or logical operations according to a result of decoding commands. The operation unit 1112 may include at least one arithmetic and logic unit (ALU).

The control unit 1113 may receive signals from the memory unit 1111, the operation unit 1112, and external devices of the processor 1100, extract or decode a command, control the signal input and output of the processor 1100, and execute processing represented by a program.

The cache memory unit 1120 may temporarily store data so as to compensate for a difference in data processing speed between the core unit 1110 operating at a high speed and an external device operating at a low speed. The cache memory unit 1120 may include a primary storage section 1121, a secondary storage section 1122, and a tertiary storage section 1123.

In general, the cache memory unit 1120 may include the primary and secondary storage sections 1121 and 1122. When high capacity of storage is required, the cache memory unit 1120 may further include the tertiary storage section 1123. If necessary, the cache memory unit 1120 may include more storage sections. In other words, the number of storage sections included in the cache memory unit 1120 may vary depending on the design.

The primary, secondary, and tertiary storage sections 1121, 1122, and 1123 may have the same or different processing speeds for storing and sensing data. When the respective storage sections have different processing speeds, the primary storage section 1121 may have the highest processing speed among the primary, secondary, and tertiary storage sections 1121, 1122, and 1123.

At least one of the primary, secondary, and tertiary storage sections 1121, 1122, and 1123 may employ at least one of the embodiments described above with reference to FIGS. 4A to 7B. For example, the cache memory unit 1120 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Accordingly, read operation characteristics of the cache memory unit 1120 may be improved. As a result, read operation characteristics of the processor 1100 may be also improved.

As illustrated in FIG. 9, all of the primary, secondary, and tertiary storage sections 1121, 1122, and 1123 may be included in the cache memory unit 1120. The primary, secondary, and tertiary storage sections 1121, 1122, and 1123 of the cache memory unit 1120 may be provided outside the core unit 1110 to compensate for a difference in data processing speed between the core unit 1110 and an external device. Alternatively, the primary storage section 1121 of the cache memory unit 1120 may be located in the core unit 1110, and the secondary storage section 1122 and the tertiary storage section 1123 may be provided outside the core unit 1110 to enhance the function of supplementing the difference in data processing speed. In still another embodiment, the primary and secondary storage sections 1121 and 1122 may be located in the core unit 1110 and the tertiary storage section 1123 may be located outside the core unit 1110.

The bus interface 1130 may connect the core unit 1110, the cache memory unit 1120, and the external device so that data may be efficiently transferred therebetween.

According to an embodiment of the present disclosure, the processor 1100 may include a plurality of core units 1110 which may share the cache memory unit 1120. The plurality of core units 1110 and the cache memory unit 1120 may be directly coupled to each other, or may be coupled through the bus interface 1130. Each of the plurality of core units 1110 may have the same configuration as the above-described core unit.

When the processor 1100 includes the plurality of core units 1110, the number of primary storage sections 1121 of the cache memory unit 1120 may correspond to the number of core units 1110. Each of the primary storage sections 1121 may be included in each of the core units 1110. In addition, the secondary storage section 1122 and the tertiary storage section 1123 may be provided outside the plurality of core units 1110 and shared by the plurality of core units 1110 through the bus interface 1130. The primary storage section 1121 may have a faster processing speed than the secondary and tertiary storage sections 1122 and 1123.

In another embodiment, each of the number of primary storage sections 1121 and the number of secondary storage sections 1122 may correspond to the number of core units 1110. Each of the primary storage sections 1121 and each of the secondary storage sections 1122 may be included in each of the core units 1110. The tertiary storage section 1123 may be provided outside the plurality of core units 1110 and shared by the plurality of core units 1110 through the bus interface 1130.

According to an embodiment of the present disclosure, the processor 1100 may further include an embedded memory unit 1140 storing data, a communication module unit 1150 transmitting or receiving data to or from an external device, a memory control unit 1160 driving an external memory device, and a media processing unit 1170 processing data input from an external input device and outputting the processed data or processing and outputting data, processed by the processor 1100, to an external interface device. The processor 1100 may further include various other modules and devices. The added modules may exchange data with each other and with the core unit 1110 and the cache memory unit 1120 through the bus interface 1130.

The embedded memory unit 1140 may include a non-volatile memory as well as a volatile memory. A volatile memory may include a dynamic random access memory (DRAM), a Mobile DRAM, a Static Random Access Memory (SRAM), and the like. A non-volatile memory may include a Read Only Memory (ROM), a NOR Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), and the like.

The communication module unit 1150 may include a module connected to a wired network, a module connected to a wireless network, or both. A wired network module may include a Local Area Network (LAN), a Universal Serial Bus (USB), an Ethernet, Power Line Communication (PLC), or the like, which transmits and receives data through a transmission line. A wireless network module may include Infrared Data Association (IrDA), Code Division Multiple Access(CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like, which transmits and receives data without a transmission line.

The memory control unit 1160 may include various controllers for processing and managing data transferred between the processor 1100 and an external storage device which operates according to a different communication standard from that of the processor 1100. For example, the memory control unit 1160 may include a controller controlling Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multi-media card (MMC), an embedded MMC (eMMC), a compact flash (CF) card, or the like.

The media processing unit 1170 may process data processed by the processor 1100, or data in the form of video or audio or in another form, which is input from an external input device, and may output the processed data to an external interface device. The media processing unit 1170 may include a Graphics Processing Unit (GPU), a Digital Signal Processor (DSP), a High Definition Audio (HD audio), a high definition multimedia interface (HDMI) controller, or the like.

Figure 10:
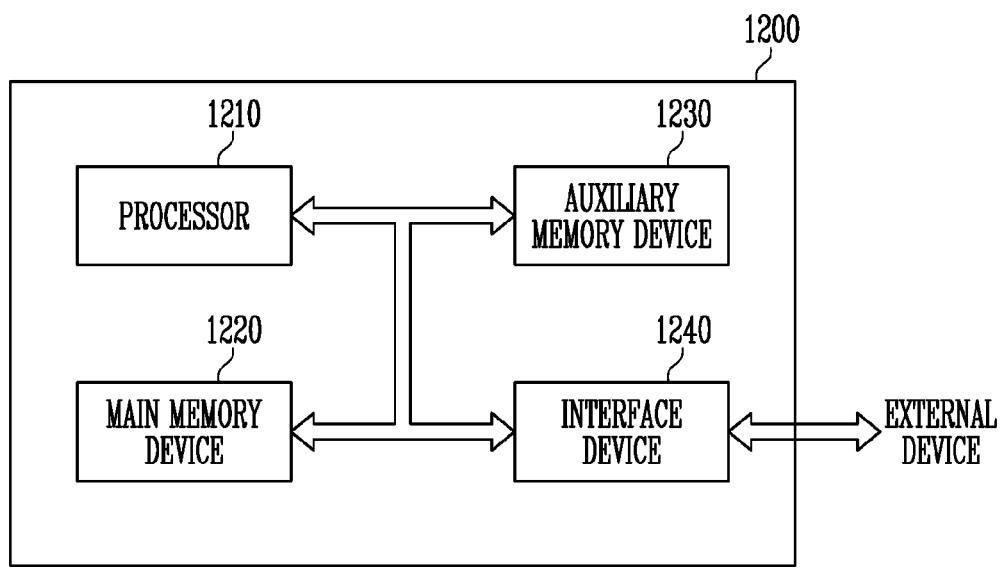
FIG. 10 illustrates a system employing a memory device according to an embodiment of the present disclosure.

FIG. 10 illustrates a system 1200 employing a memory device according to an embodiment of the present disclosure.

Referring to FIG. 10, the system 1200 may refer to a device configured to process data. To perform a series of manipulations for data, the system 1200 may perform inputting, processing, outputting, communicating, storing, and the like to perform a series of operations on data. The system 1200 may include a processor 1210, a main memory device 1220, an auxiliary memory device 1230, and an interface device 1240. According to an embodiment of the present disclosure, the system 1200 may be a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 may control the decoding of input commands and the processing of data stored in the system 1200. The processor 1210 may include one or more of a microprocessor unit (MPU), a central processing unit (CPU), a single/multi-core processor, a graphic processing unit (GPU), an application processor (AP), digital signal processor (DSP), and so on.

The main memory device 1220 may refer to a storage that stores program codes and/or data from the auxiliary memory device 1230 when a program is executed. The stored program codes and/or data may be retained even when power is off. The main memory unit 1220 may include at least one of the embodiments described above with reference to FIGS. 4A to 7B. For example, the main memory device 1220 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Accordingly, read operation characteristics of the main memory device 1220 may be improved. As a result, read operation characteristics of the system 1200 may be also improved.

The main memory device 1220 may further include one or more of a static random access memory (SRAM), a dynamic random access memory (DRAM), and the like, which lose all data stored therein when power is off. In another example, the main memory device 1220 may not include the memory device according to the above-described embodiment, and may include one or more of a static random access memory (SRAM), a dynamic random access memory (DRAM), and the like.

The auxiliary memory device 1230 may refer to a memory device designed to store program codes or data. Although the auxiliary memory device 1230 is slower than the main memory device 1220, the auxiliary memory device 1230 may store more data than the main memory device 1220. The auxiliary memory device 1230 may employ at least one of the embodiments described above with reference to FIGS. 4A to 7B. For example, the auxiliary memory device 1230 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Accordingly, read operation characteristics of the auxiliary memory device 1230 may be improved. As a result, read operation characteristics of the system 1200 may be also improved.

In addition, the auxiliary memory device 1230 may further include a data storage system such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

In another embodiment, the auxiliary memory device 1230 may not include the memory device according to any of the embodiments described above with reference to FIGS. 4A to 7B, and may include a data storage system such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or so on.

The interface device 1240 may perform exchange of commands and data between the system 1200 and an external device. The interface device 1240 may include one or more of a keypad, a keyboard, a mouse, a speaker, a microphone, a display, any of various human interface devices (HIDs), a communication device, and so on. The communication device may include a module connected to a wired network, a module connected to a wireless network, or both. The wired network module may include a Local Area Network (LAN), a Universal Serial Bus (USB), an Ethernet, Power Line Communication (PLC), or the like, which transmits and receives data through a transmission line. The wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network(USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like, which transmits and receives data without a transmission line.

Figure 11:
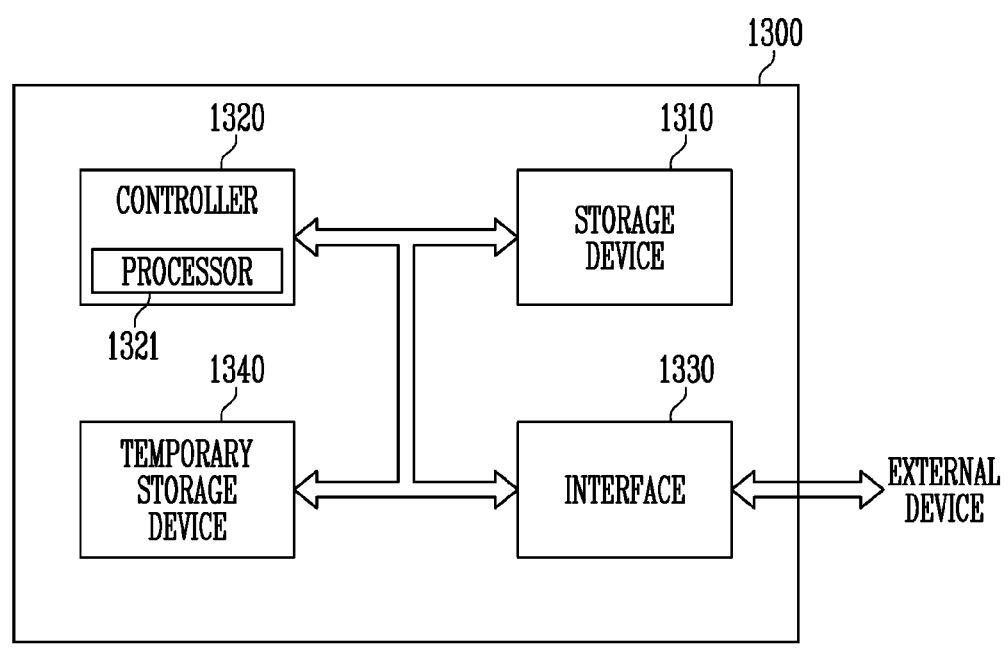
FIG. 11 illustrates a data storage system employing a memory device according to an embodiment of the present disclosure.

FIG. 11 illustrates a data storage system 1300 employing a memory device according to an embodiment of the present disclosure.

Referring to FIG. 11, the data storage system 1300 may include a storage device 1310 which has a non-volatile characteristic as a component for storing data, a controller 1320 which controls the storage device 1310, an interface 1330 for communicating with an external device, and a temporary storage device 1340 for storing data temporarily. The data storage system 1300 may be a disk type device such as a hard disk drive (HDD), a compact disc read only memory (CDROM), a digital versatile disc (DVD), or a solid state disk (SSD), or a card type device such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), or a compact flash (CF) card.

The storage device 1310 may include a non-volatile memory. The non-volatile memory may include any of a read only memory (ROM), a NOR flash memory, a NAND flash memory, a phase change random access memory (PRAM), a resistive random access memory (RRAM), a magnetic random access memory (MRAM), and the like.

The memory controller 1320 may control data exchange between the storage device 1310 and the interface 1330. The controller 1320 may include a processor 1321 for performing an operation for processing commands input through the interface 1330 from an external device of the data storage system 1300.

The interface 1330 may be provided to exchange commands and data between the data storage system 1300 and the external device. When the data storage system 1300 is a card type device, the interface 1330 may be compatible with interfaces which are used in devices such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and the like. When the data storage system 1300 is a disk type device, the interface 1330 may be compatible with interfaces such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like. The interface 1330 may be compatible with one or more interfaces having different types.

The temporary storage device 1340 may store data temporarily for efficiently transferring data between the interface 1330 and the storage device 1310 according to an interface with an external device and diversifications and high performance of a controller and a system. The temporary storage device 1340 may include at least one of the embodiments described above with reference to FIGS. 4A to 7B. For example, the temporary storage device 1340 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Accordingly, read operation characteristics of the temporary storage device 1340 may be improved. As a result, read operation characteristics of the data storage system 1300 may be also improved.

Figure 12:
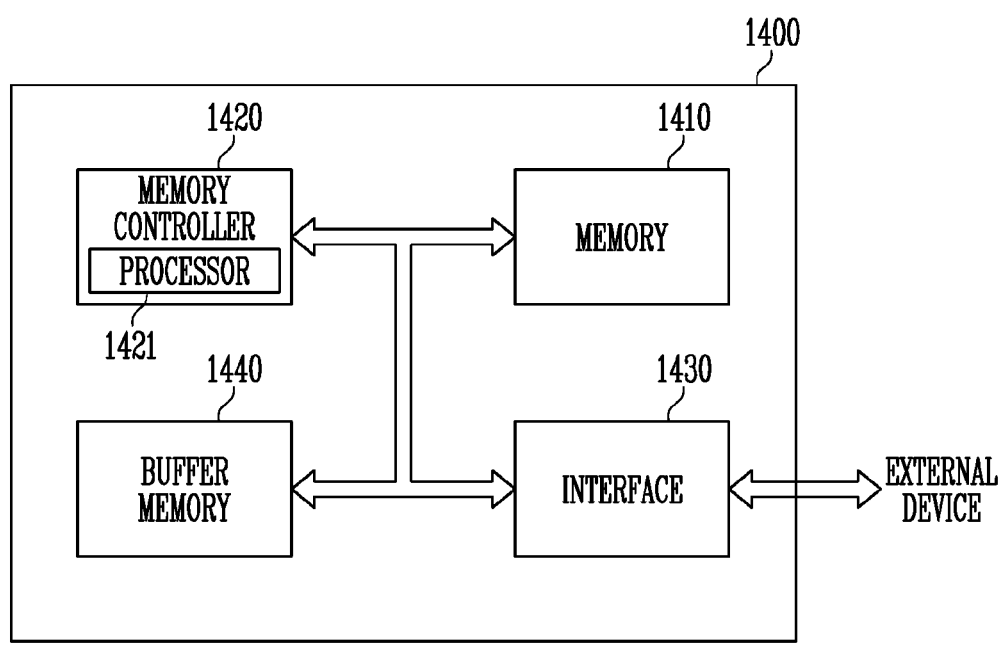
FIG. 12 illustrates a memory system employing a memory device according to an embodiment of the present disclosure.

FIG. 12 illustrates a memory system 1400 employing a memory device according to an embodiment of the present disclosure.

Referring to FIG. 12, the memory system 1400 may include a memory 1410 which has a non-volatile characteristic as a component for storing data, a memory controller 1420 which controls the memory 1410, and an interface 1430 for communicating with an external device. The memory system 1400 may be a card type device such as a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

The memory 1410 storing data may include at least one of the embodiments described above with reference to FIGS. 4A to 7B. For example, the memory 1410 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Thus, read operation characteristics of the memory 1410 may be improved. As a result, read operation characteristics of the memory system 1400 may be also improved.

The memory 1410 may include a read only memory (ROM), a NOR flash memory, a NAND flash memory, a phase change random access memory (PRAM), a resistive random access memory (RRAM), a magnetic random access memory (MRAM), or the like.

The memory controller 1420 may control data exchange between the memory 1410 and the interface 1430. The memory controller 1420 may include a processor 1421 for performing an operation for processing commands input through the interface 1430 from an external device of the memory system 1400.

The interface 1430 may be provided to exchange commands and data between the memory system 1400 and the external device. The interface 1430 may be compatible with interfaces which are used in devices such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and the like. The interface 1430 may be compatible with one or more interfaces having different types.

According to an embodiment, the memory system 1400 may further include a buffer memory 1440 for efficiently transferring data input and output between the interface 1430 and the memory 1410 according to an interface with an external device and diversification and high performance of a memory controller and a memory system. The buffer memory 1440 may include at least one of the embodiments described above with reference to FIGS. 4A to 7B. For example, the buffer memory 1440 may include bit lines, word lines crossing the bit lines, and memory cells coupled to and disposed between the bit lines and the word lines. During a read operation, a selected word line, among the word lines, may be precharged, the selected word line may be floated, and a selected bit line, among the bit lines, may be driven so that a voltage level of the selected bit line may be increased. When a selected memory cell is turned on, the driving of the selected bit line may be stopped to prevent the selected memory cell from being repetitively turned on and off by the increased voltage level of the selected bit line. Thus, read operation characteristics of the buffer memory 1440 may be improved. As a result, the read operation characteristics of the memory system 1400 may be also improved.

According to an embodiment, the buffer memory 1440 may further include a static random access memory (SRAM) or a dynamic random access memory (DRAM), which has a volatile characteristic, and a Read Only Memory(ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a non-volatile characteristic.

In another embodiment, the buffer memory 1440 may not include the memory device according to any of the embodiments described above with reference to FIGS. 4A to 7B, and may include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a non-volatile characteristic.

Various embodiments of the present disclosure provide an electronic device stably reading data of a resistive memory.

What is claimed is:

1. A method of operating an electronic device including memory cells, the method comprising:
   precharging a selected word line associated with a memory cell;
   floating the selected word line;
   driving a selected bit line to increase a voltage level of the selected bit line, the selected bit line being associated with the memory cell;
   sensing a voltage level of the selected word line; and
   stopping the driving of the selected bit line in response to an increase of the voltage level of the selected word line,
   wherein the voltage level of the selected word line is increased when the memory cell is turned on.

2. The method of claim 1, wherein the stopping of the driving of the selected bit line comprises turning off a switch coupling the memory cell and the selected bit line.

3. The method of claim 1, wherein the stopping of the driving of the selected bit line comprises decreasing the voltage level of the selected bit line.

4. The method of claim 1, wherein the driving of the selected bit line is stopped at a predetermined time after the selected word line is floated, the predetermined time corresponding to a time when the memory cell is turned on.

5. The method of claim 1, further comprising reading data stored in the memory cell by sensing a voltage level of the selected word line, after stopping the driving of the selected bit line.

6. A method of operating an electronic device including memory cells, the method comprising:
   precharging a selected local word line;
   floating the selected local word line;
   turning on a selected local switch to apply a read voltage to a selected memory cell through a selected local bit line, the selected memory cell being coupled to and disposed between the selected local word line and the selected local bit line, the selected local switch coupling the selected local bit line to a global bit line;
   sensing a voltage level of the selected local word line; and
   turning off the selected local switch in response to an increase of the voltage level of the selected local word line,
   wherein the voltage level of the selected local word line is increased when the selected memory cell is turned on by the read voltage.

7. The method of claim 6, wherein the turning off the selected local switch comprises turning off the selected local switch at a predetermined time after floating the selected local word line, the predetermined time corresponding to a time when the selected memory cell is turned on.

8. The method of claim 6, wherein a voltage level of the selected local bit line increases when the selected local switch is turned on.

9. The method of claim 6, wherein the electronic device further includes a global switch coupled to the global bit line, and
   wherein the global switch is turned off when the selected local switch is turned off.

10. The method of claim 6, wherein the electronic device further includes a global switch coupled to the global bit line, and
    wherein the global switch is turned off after the selected local switch is turned off.

11. The method of claim 6, wherein the electronic device further includes a local discharge transistor coupled to the selected local bit line, and wherein the local discharge transistor is turned on when the selected local switch is turned off.

12. The method of claim 6, wherein the electronic device further includes a global switch coupled to the global bit line and a global discharge transistor coupled to the global bit line, and
wherein the global switch is turned off and the global discharge transistor is turned on when the selected local switch is turned off.

13. An electronic device including a semiconductor memory, the semiconductor memory comprising:
a bit line;
a word line crossing the bit line; and
a memory cell coupled to and disposed between the bit line and the word line,
wherein, in a read operation, when the word line, which is in a precharged state, is floated, the bit line is driven to increase a voltage level of the bit line and stopped when the memory cell is turned on, and
wherein a voltage level of the selected local word line in a floating state is sensed and the driving of the bit line is stopped in response to an increase of the voltage level of the word line in the floating state.

14. The electronic device of claim 13, wherein the driving of the bit line is stopped by turning off a switch coupling the memory cell and the bit line.

15. The electronic device of claim 13, wherein the driving of the bit line is stopped by decreasing the voltage level of the bit line.

16. The electronic device of claim 13, wherein the driving of the bit line is stopped at a predetermined time after the word line is floated, the predetermined time corresponding to a time when the memory cell is turned on.

17. The electronic device of claim 13, wherein data stored in the memory cell is read by sensing a voltage level of the word line after the driving of the bit line is stopped.

* * * * *